(12) United States Patent
Chong (10) Patent No.: US 12,193,199 B2
(45) Date of Patent: Jan. 7, 2025

(54) INTEGRATED CAPACITOR COVER

(71) Applicant: BorgWarner US Technologies LLC, Wilmington, DE (US)

(72) Inventor: Yew Ming Chong, Hougang (SG)

(73) Assignee: BorgWarner US Technologies LLC, Wilmington, DE (US)

( * ) Notice: Subject to any disclaimer, the term of this patent is extended or adjusted under 35 U.S.C. 154(b) by 170 days.

(21) Appl. No.: 17/960,386

(22) Filed: Oct. 5, 2022

(65) Prior Publication Data
US 2024/0121922 A1     Apr. 11, 2024

(51) Int. Cl.
H05K 7/20     (2006.01)
B60L 50/40     (2019.01)
H01G 9/08     (2006.01)

(52) U.S. Cl.
CPC ............ *H05K 7/209* (2013.01); *B60L 50/40* (2019.02); *H01G 9/08* (2013.01)

(58) Field of Classification Search
None
See application file for complete search history.

(56) References Cited

U.S. PATENT DOCUMENTS

| | | | | |
|---|---|---|---|---|
| 5,426,405 A * | 6/1995 | Miller | ............ | H05K 1/141 |
| | | | | 257/726 |
| 5,631,821 A * | 5/1997 | Muso | ............ | H05K 7/20927 |
| | | | | 361/709 |
| 5,966,291 A * | 10/1999 | Baumel | ............ | H05K 7/20927 |
| | | | | 165/80.4 |
| 6,166,937 A * | 12/2000 | Yamamura | ............ | H01L 25/165 |
| | | | | 257/E23.098 |
| 7,684,195 B2 * | 3/2010 | Kerner | ............ | H05K 7/20872 |
| | | | | 165/80.4 |
| 10,595,393 B2 * | 3/2020 | Sato | ............ | H03F 1/30 |
| 11,049,819 B2 * | 6/2021 | Lamorey | ............ | H01L 23/552 |
| 11,268,505 B2 * | 3/2022 | Sasaki | ............ | H02K 5/10 |
| 11,328,976 B1 * | 5/2022 | Refai-Ahmed | ............ | H01L 23/473 |
| 11,889,665 B2 * | 1/2024 | Ono | ............ | H02M 7/003 |
| 2010/0276799 A1 * | 11/2010 | Heng | ............ | H01L 23/36 |
| | | | | 438/118 |
| 2022/0142014 A1 * | 5/2022 | Ono | ............ | H05K 5/04 |
| | | | | 361/699 |

FOREIGN PATENT DOCUMENTS

EP     1843392 A1     10/2007

* cited by examiner

*Primary Examiner* — Courtney L Smith
(74) *Attorney, Agent, or Firm* — Joshua M. Haines; Bookoff McAndrews, PLLC (57) ABSTRACT

A system for an electric vehicle may include a housing, a cover configured to couple to the housing, the cover including an opening; a capacitor disposed within the housing, wherein the capacitor is mounted directly to the cover; and a heatsink disposed within or adjacent to the opening of the cover, wherein the heatsink is thermally connected to the capacitor.

20 Claims, 7 Drawing Sheets

INTEGRATED CAPACITOR COVER

TECHNICAL FIELD

The present disclosure relates to a system of an electric vehicle including a housing for a capacitor of an electronic device of the electric vehicle, the capacitor, and a cover for the housing. More specifically, the present disclosure relates to a system including the capacitor that is directly mounted to the cover of the housing to permit direct heat dissipation from the capacitor to an external environment of the housing.

BACKGROUND

An electric vehicle (e.g., an automobile) may include various electronic devices, such as an electronic control unit (ECU), an inverter, a converter, etc. The electronic devices may utilize capacitors (e.g., bulk capacitors, DC-link capacitors, etc.) to stabilize an output of a power supply during situations where current is not available. During operation, the capacitors generate heat which is to be dissipated.

In an electric vehicle, a system may include a housing, a cover that connects to the housing, and a capacitor that is provided in the housing. The housing may house the capacitor, the PCB, and various other components.

The capacitor may be a DC-link capacitor, a bulk capacitor, or the like, and may be used in conjunction with an electronic device (e.g., an ECU, an inverter, a converter, etc.) of the electric vehicle. The capacitor may be mounted to the housing via mounts that extend through the PCB. For example, the capacitor may connect to mounts that extend through the PCB towards an internal surface of the housing. To accommodate the mounts, the PCB includes mounting holes that permit the mounts to extend through the PCB and mount to the housing.

The capacitor may dissipate heat via a bus bar of the capacitor that contacts a heatsink provided below the capacitor. The heatsink may dissipate heat from the bus bar of the capacitor to the housing.

The system has several areas for improvement. First, heat dissipation might be inadequate because the capacitor cannot directly dissipate heat to an external environment of the housing. Accordingly, the performance and reliability of the capacitor and/or the electronic device may be reduced. Second, structural integrity of the capacitor may be reduced due to failure of the mounts during installation, during operation of the electric vehicle, etc. Third, layout space of the PCB might be reduced due to the area occupied by the mounting holes.

SUMMARY

According to an example embodiment, a system for an electric vehicle may include a housing; a cover configured to couple to the housing, the cover including an opening; a capacitor disposed within the housing, wherein the capacitor is mounted directly to the cover; and a heatsink disposed within or adjacent to the opening of the cover, wherein the heatsink is thermally connected to the capacitor.

The system may include a printed circuit board (PCB) provided in the housing. The capacitor is not mounted directly to the PCB.

The capacitor may be a DC-link capacitor or a bulk capacitor.

The capacitor may be configured to connect to an electronic device of the electric vehicle. The electronic device may be a control unit (ECU), an inverter, or a converter.

The heatsink is directly integrated with the capacitor.

The capacitor is not mounted directly to the housing.

An external surface of the heatsink is exposed directly to an external environment of the housing.

According to an example embodiment, an electric vehicle may include a housing; a cover configured to couple to the housing, the cover including an opening; a capacitor disposed within the housing, wherein the capacitor is mounted directly to the cover; and a heatsink disposed within or adjacent to the opening of the cover, wherein the heatsink is thermally connected to the capacitor.

The electric vehicle may include a printed circuit board (PCB) provided in the housing. The capacitor is not mounted directly to the PCB.

The capacitor may be configured to connect to an electronic device of the electric vehicle. The electronic device may be a control unit (ECU), an inverter, or a converter.

The heatsink is directly integrated with the capacitor.

The capacitor is not mounted directly to the housing.

An external surface of the heatsink is exposed directly to an external environment of the housing.

According to an example embodiment, a method of cooling a capacitor in an electrically-powered vehicle may include cooling a capacitor by directing heat from an external surface of the capacitor to a heatsink, wherein the heat from the heatsink is dissipated directly to an external environment of a housing.

The heat is directed from the external surface of the capacitor directly to the heatsink.

The heat is directed from the external surface of the capacitor through a thermal interface material.

The capacitor is mounted directly to a cover of the housing, and wherein the capacitor is not mounted to the housing.

The heatsink is exposed to the external environment of the housing.

The capacitor directly contacts the heatsink.

It may be understood that both the foregoing general description and the following detailed description are exemplary and explanatory only and are not restrictive of the invention, as claimed.

DETAILED DESCRIPTION

To address at least the foregoing issues identified above, a system 100 may include a housing 110, a PCB 120, a cover 130, a capacitor 140, a heatsink 150, and a connector 160. More specifically, the system 100 may include a housing 110, a cover 130 that is configured to couple to the housing 110 and that includes an opening 131, a capacitor 140 that is disposed within the housing 110 and that is mounted directly to the cover 130, and a heatsink 150 that is disposed within or adjacent to the opening 131 of the cover 130 and that is thermally connected to the capacitor 140, as shown in FIGS. 1-7.

The capacitor 140 of the system 100 is mounted directly to the cover 130 instead of being mounted to the housing 110 via mounts that extend through mounting holes of the PCB 120. In this way, the system 100 improves the structural integrity of the mounting of the capacitor 140 by removing the need for the mounts. Further, the system 100 improves layout space of the PCB 120 by removing the need for the mounting holes of the PCB 120. Further still, the system 100 reduces the part count by removing the need for, at least, the mounts.

The capacitor 140 is thermally connected to a heatsink 150. The heatsink 150 is disposed within, or adjacent to, the opening 131 of the cover 130. The heatsink has an internal surface 151 that faces towards the external surface 141 of the capacitor 140, and has an external surface 152 that is directly exposed to an external environment of the housing 110. This is in contrast to a heatsink that is provided internal to the housing 110. The system 100 may improve heat dissipation of the capacitor 140 by permitting direct temperature exchange with an external environment of the housing 110 and a shorter path 170 for heat to travel from the capacitor 140 to the external environment.

Figure 6:
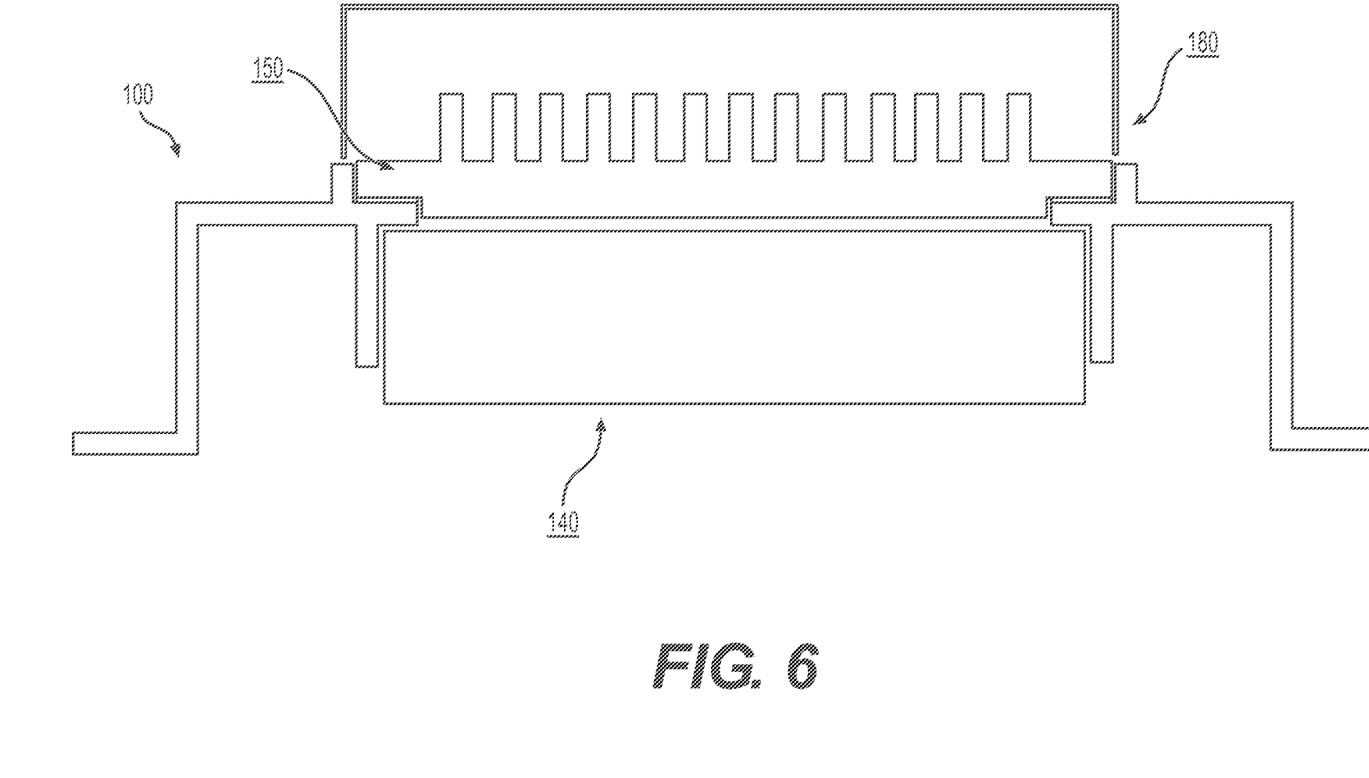
FIG. 6 is a diagram of a liquid cooled chamber provided on the heatsink.

The heatsink 150 is further configured having a plurality of fins 154 that extend away from the cover 130 in the external environment of the housing 110. The fins 154 are spaced to provide channels 155 formed therebetween. The fins 154 provide an increased area heat exchange surface to exchange thermal energy (heat) communicated from the capacitor 140 with the external environment (or within a liquid cooled chamber 180 in alternative embodiments as shown in FIG. 6). In such alternative embodiments, the liquid cooled chamber 180 may dissipate heat into the external environment.

Figure 1:
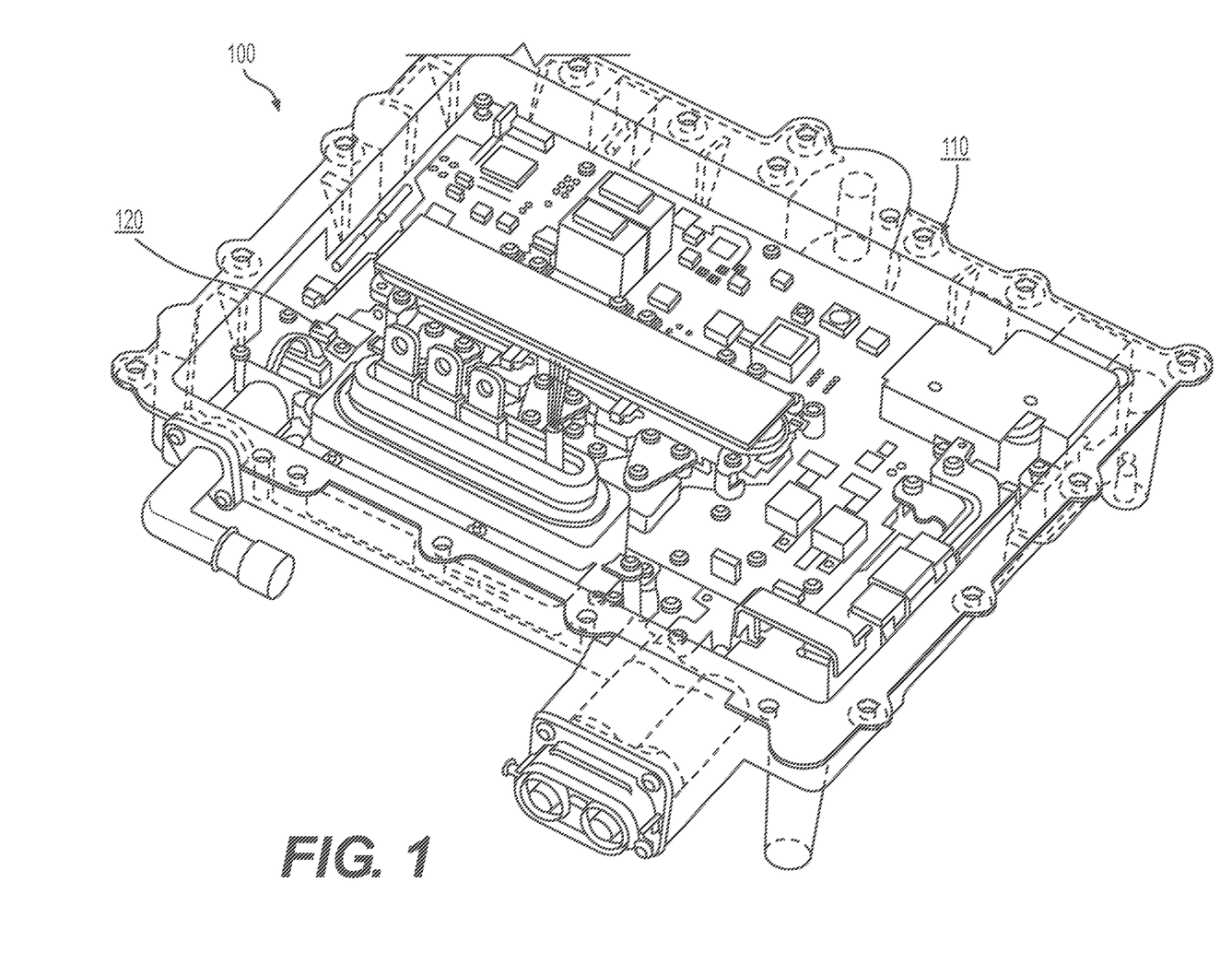
FIG. 1 is a diagram of a system including a housing for a capacitor of an electronic device of an electric vehicle and a PCB.
Figure 2:
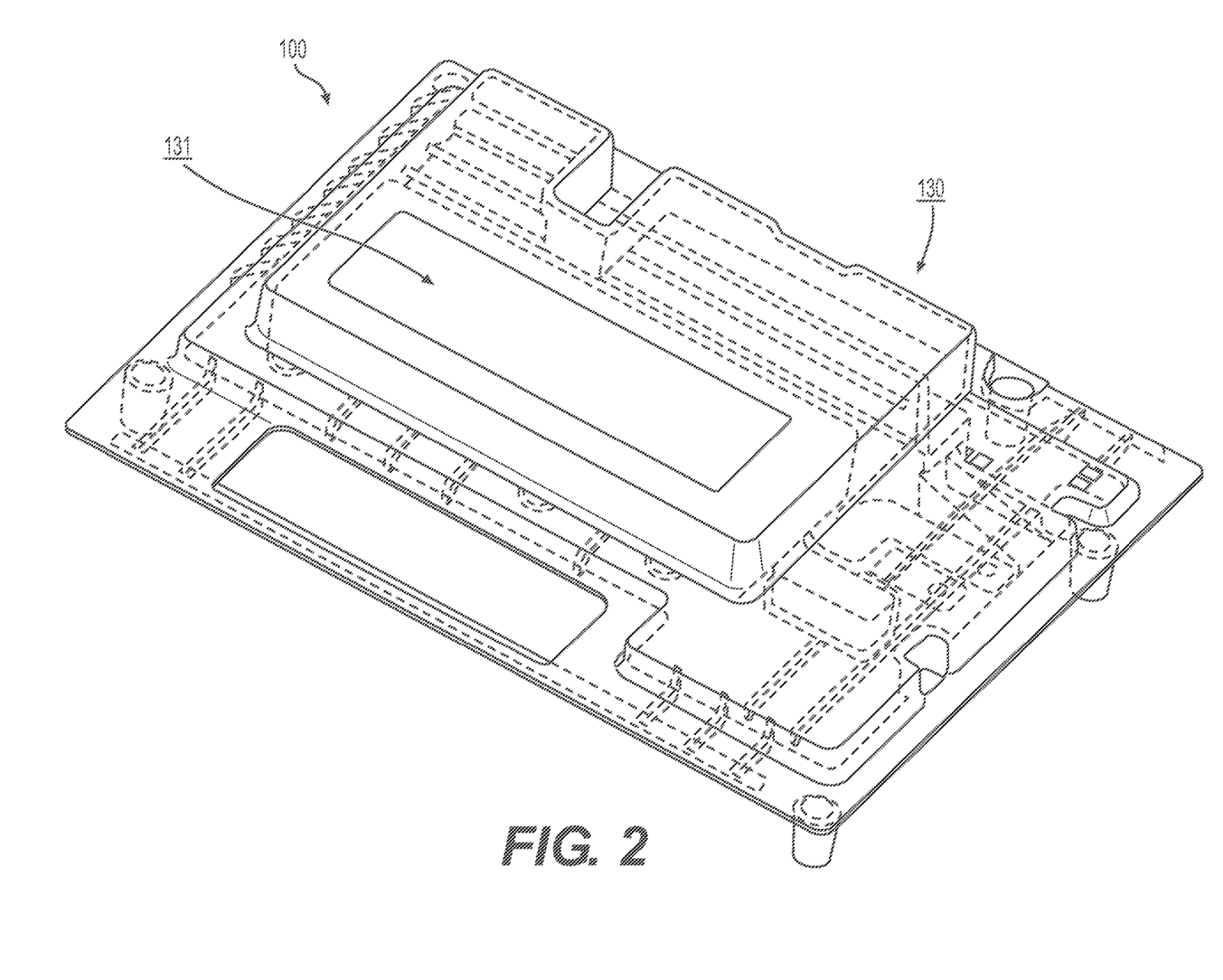
FIG. 2 is a diagram of a cover of the housing.
Figure 3:
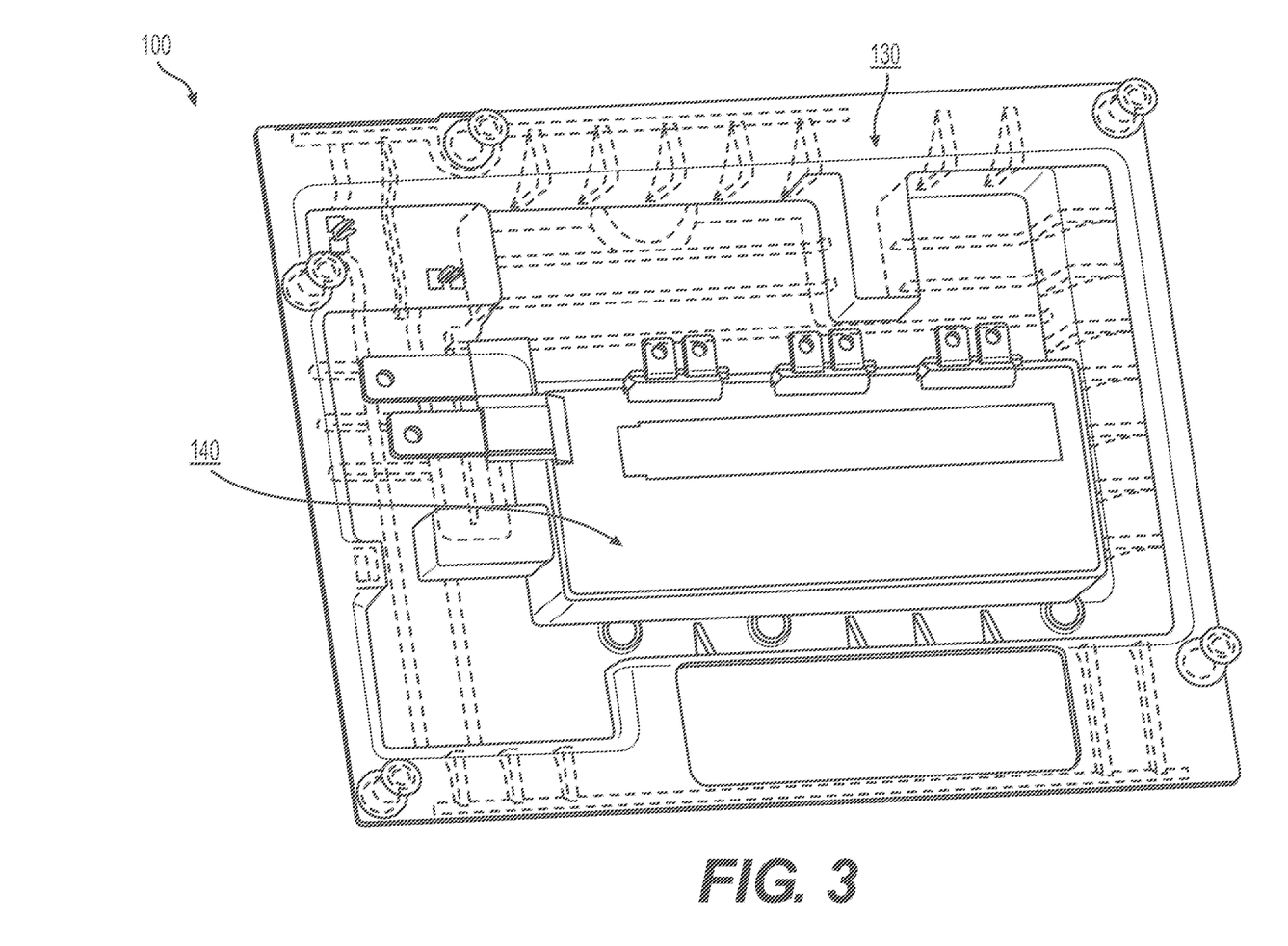
FIG. 3 is a diagram of the cover and the capacitor.

As shown in FIG. 1, the PCB 120 may be provided in the housing 110. As shown, the PCB 120 does not include mounting holes for mounts for the capacitor 140. As shown in FIG. 2, the cover 130 includes an opening 131. As shown in FIG. 3, the capacitor 140 is directly mounted to the cover 130 such that the capacitor 140 is exposed to and/or within the opening 131 of the cover 130. The capacitor 140 may be mounted directly to the cover 130 via any suitable mounting mechanism. For instance, the capacitor 140 may be directly mounted to the cover 130 via an adhesive, via a fastener (e.g., a screw), via direct integration with the cover, or the like.

Figure 4:
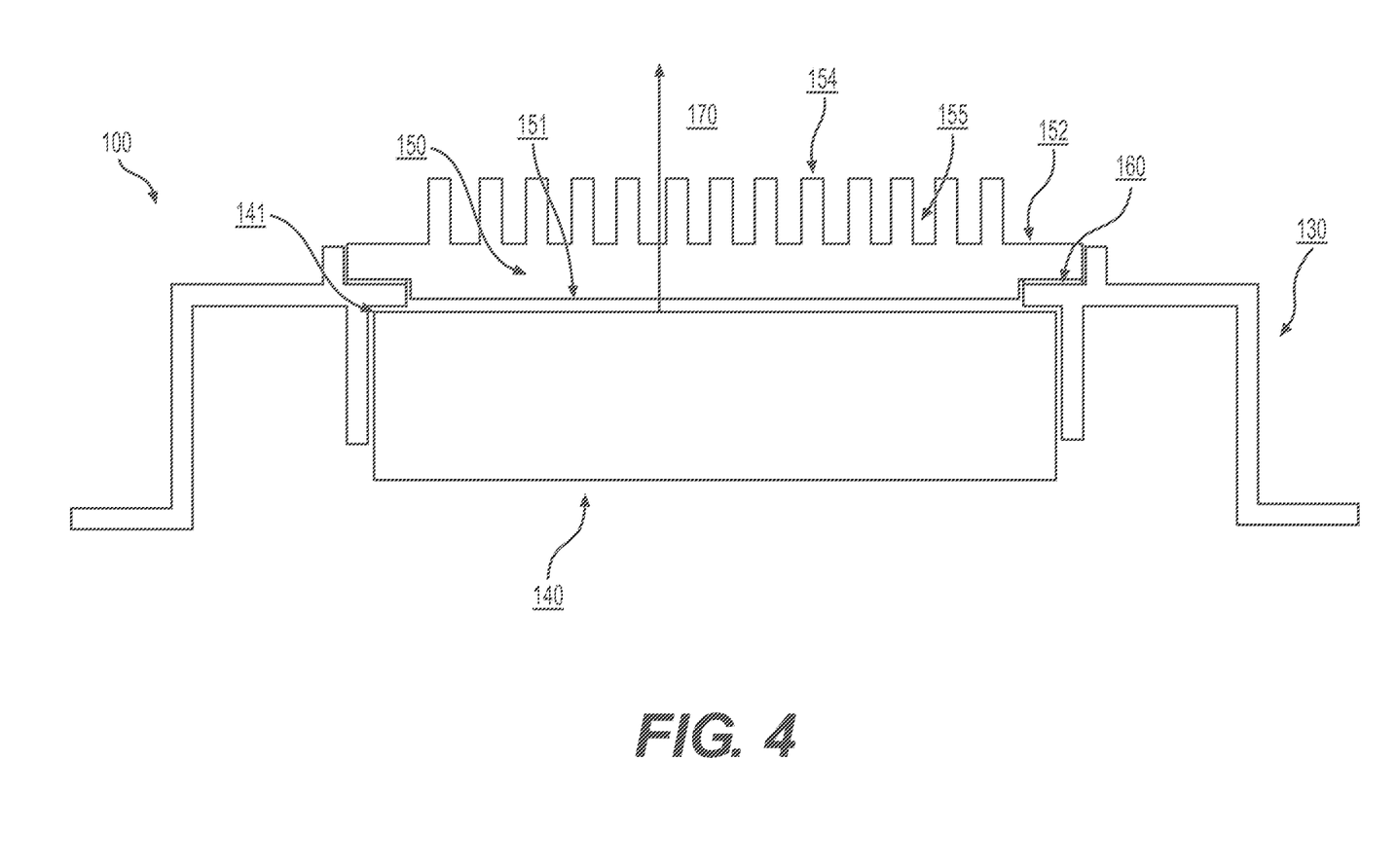
FIG. 4 is a diagram of the cover, the capacitor, and a heatsink.

As shown in FIG. 4, the heatsink 150 may be connected to the cover 130 via connectors 160. The connectors 160 may be adhesive, fasteners, or the like. Alternatively, the heatsink 150 may be directly integrated with the cover 130. The heatsink 150 may be formed of any suitable material such as a thermally conductive plastic, extruded aluminum, diecast aluminum, copper, or the like. The heatsink 150 may permit heat dissipation from the capacitor 140 to an external environment of the housing 110. In some implementations, the heatsink 150 directly contacts the capacitor 140. Alternatively, one or more intervening elements (e.g., a thermal interface material) may be provided between the heatsink 150 and the capacitor 140, such as a thermal pad, a gap pad, another heatsink, or the like. In other embodiments, a space or gap may exist between the capacitor 140 and the heatsink 150.

As shown in FIG. 4, heat may be dissipated from the capacitor 140 along a path 170. For instance, heat may be dissipated from an external surface 141 of the capacitor 140 to an internal surface 151 of the heatsink 150, and directly from the heatsink 150 to an external environment of the housing 110. In some cases, a gap may exist between the external surface 141 of the capacitor 140 and the internal surface 151 of the heatsink 150. Alternatively, one or more intervening components (e.g., thermal materials, heatsinks, pads, etc.) may be provided between the external surface 141 of the capacitor 140 and the internal surface 151 of the heatsink 150. Alternatively, the external surface 141 of the capacitor 140 may directly contact the internal surface 151 of the heatsink 150 in some cases. In this way, a method of cooling the capacitor 140 may include cooling the capacitor 140 by directing heat from an external surface 141 of the capacitor 140 to the heatsink 150. The heat from the heatsink 150 is dissipated directly to an external environment of the housing 110.

Figure 5:
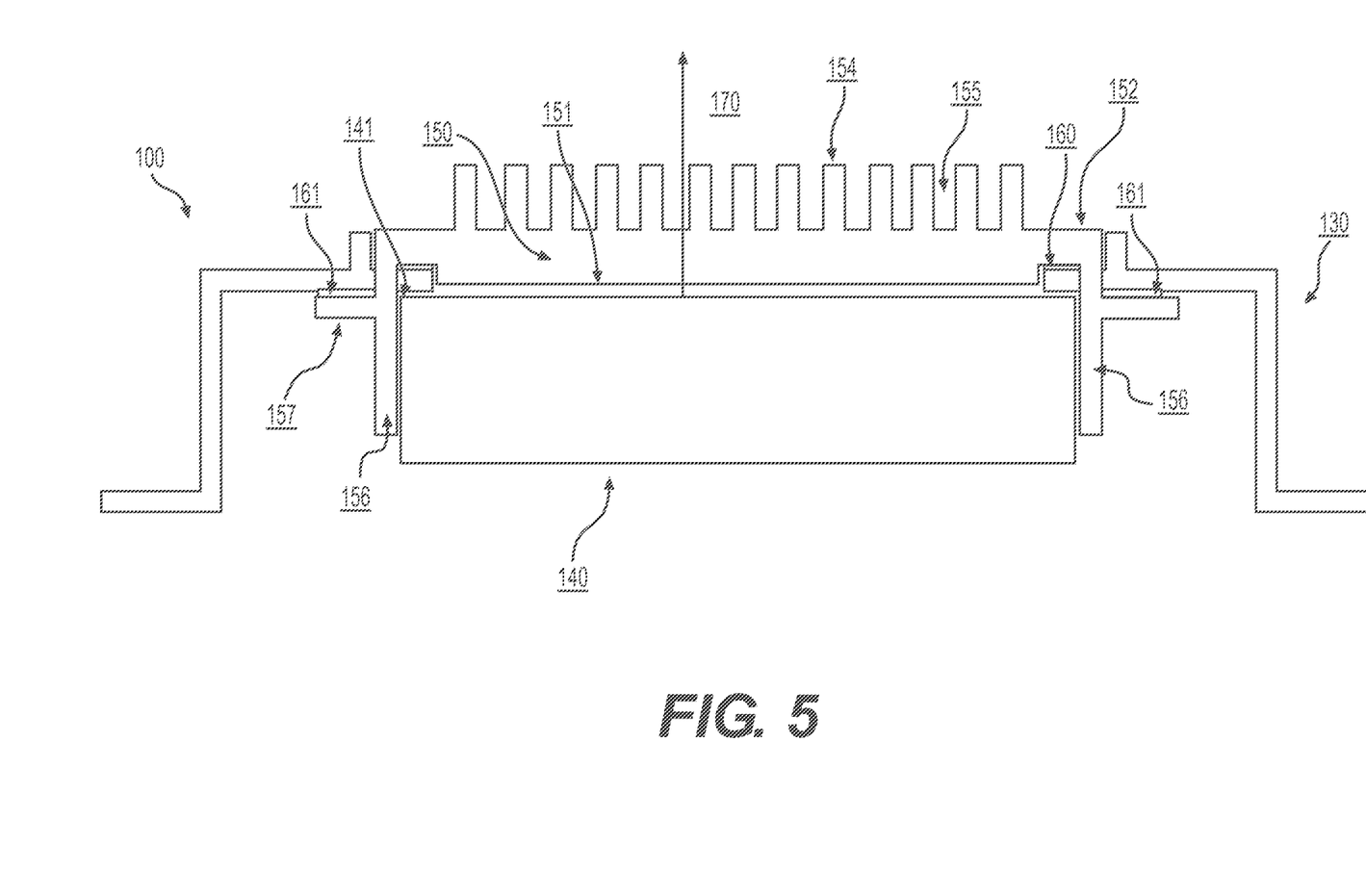
FIG. 5 is a diagram of the cover, the capacitor, and the heatsink.

As shown in FIG. 5, the heatsink 150 may be connected to capacitor 140. For example, the heatsink 150 may directly contact the capacitor 140. Alternatively, the heatsink 150 may be directly integrated with the capacitor 140. As shown in FIG. 5, the heatsink 150 may include lateral surfaces 156 that extend towards the capacitor 140, and contact the side surfaces of the capacitor 140. Moreover, as shown, the heatsink 150 may include flanges 157 that extend laterally, and that overlap with a bottom surface of the cover 130. Connectors 161 may connect the flanges 157 to the cover 130. The connectors 161 may be adhesive, fasteners, or the like.

Figure 7:
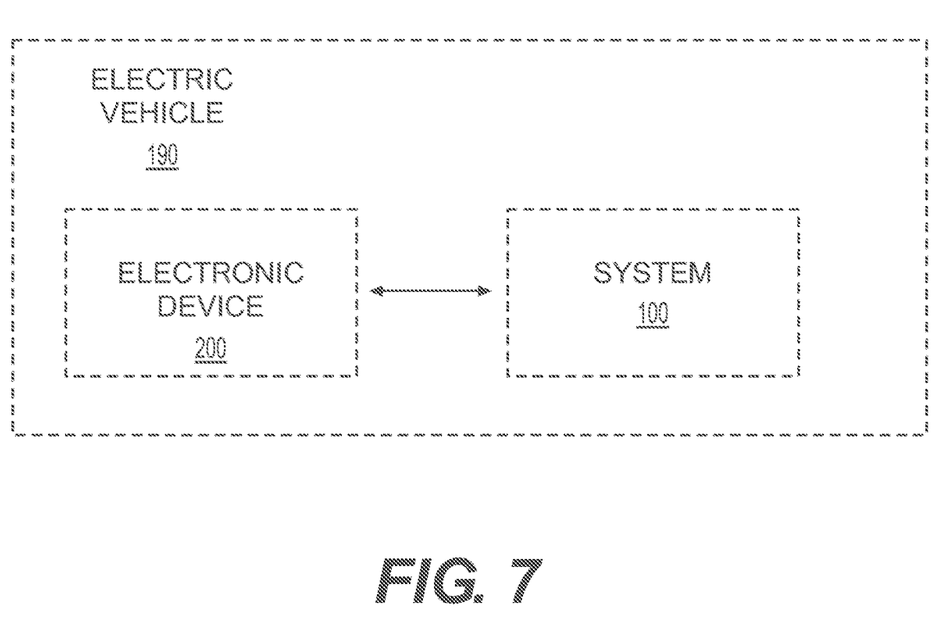
FIG. 7 is a diagram of an electric vehicle, an electronic device, and the system of FIG. 1.

As shown in FIG. 7, the system 100 may be provided in an electric vehicle 190 (e.g., an automobile, a train, a bus, an aircraft, a satellite, etc.). The electric vehicle 190 may also be referred to as an "electrically-powered vehicle." Further, the system 100 may interface with an electronic device 200 (e.g., an ECU, an inverter, a converter, etc.). In some implementations, the electronic device 200 may be provided in the housing 110 of the system 100. Alternatively, the electronic device 200 may be provided external to the housing 110.

When incorporated in the electric vehicle 190, the cover 130 may face towards a top of the electric vehicle 190 in a vertical direction, may face towards a bottom of the electric vehicle 190 in the vertical direction, may face towards a left side or a right side of the electric vehicle 190 in a lateral direction or a longitudinal direction of the electric vehicle 190.

In light of the foregoing, the system 100 may improve the structural integrity of the mounting of the capacitor 140 by removing the need for mounts. Further, the system 100 may improve layout space of the PCB 120 by removing the need for mounting holes of the PCB 120. Further still, the system 100 may reduce the part count by removing the need for, at least, the mounts.

While principles of the present disclosure are described herein with reference to illustrative embodiments for particular applications, it should be understood that the disclosure is not limited thereto. Those having ordinary skill in the art and access to the teachings provided herein will recognize additional modifications, applications, embodiments, and substitution of equivalents all fall within the scope of the embodiments described herein. Accordingly, the invention is not to be considered as limited by the foregoing description.

I claim:

1. A system for an electric vehicle, the system comprising:
a housing;
a cover configured to couple to the housing, the cover including an opening;
a capacitor disposed between the housing and the cover, wherein the capacitor is mounted directly to the cover and exposed by the opening; and
a heatsink disposed within or adjacent to the opening of the cover, wherein the heatsink is thermally connected to the capacitor.

2. The system of claim 1, further comprising:
a printed circuit board (PCB) mounted to the housing, wherein the capacitor is not mounted directly to the PCB.

3. The system of claim 1, wherein the capacitor is a DC-link capacitor or a bulk capacitor.

4. The system of claim 1, wherein the capacitor is configured to connect to an electronic device of the electric vehicle, and wherein the electronic device is a control unit (ECU), an inverter, or a converter.

5. The system of claim 1, wherein the heatsink directly contacts the capacitor.

6. The system of claim 1, wherein the capacitor is not mounted directly to the housing.

7. The system of claim 1, wherein there is an obstruction-free path between the heatsink and the capacitor.

8. An electric vehicle comprising:
a housing;
a cover configured to couple to the housing, the cover including an opening;
a capacitor disposed between the housing and the cover, wherein the capacitor is mounted directly to the cover and exposed by the opening; and
a heatsink disposed within or adjacent to the opening of the cover, wherein the heatsink is thermally connected to the capacitor.

9. The electric vehicle of claim 8, further comprising:
a printed circuit board (PCB) provided in the housing, wherein the capacitor is not mounted directly to the PCB.

10. The electric vehicle of claim 8, wherein the capacitor is a DC-link capacitor or a bulk capacitor.

11. The electric vehicle of claim 8, wherein the capacitor is configured to connect to an electronic device of the electric vehicle, and wherein the electronic device is a control unit (ECU), an inverter, or a converter.

12. The electric vehicle of claim 8, wherein the heatsink is directly integrated with the capacitor.

13. The electric vehicle of claim 8, wherein the capacitor is not mounted directly to the housing.

14. The electric vehicle of claim 8, wherein an external surface of the heatsink is exposed directly to an external environment of the housing.

15. A method of cooling a capacitor in an electrically-powered vehicle, the method comprising:
cooling the capacitor by directing heat from an external surface of the capacitor to a heatsink disposed within or adjacent to an opening of a cover coupled to a housing, wherein the capacitor is between the cover and the housing, and the heatsink is at least partially external to the cover, wherein the heatsink includes one or more flanges that contact an inner surface of the cover, and wherein the heat from the heatsink is dissipated directly to an external environment of the housing.

16. The method of claim 15, wherein the heat is directed from the external surface of the capacitor directly to the heatsink.

17. The method of claim 15, wherein the heat is directed from the external surface of the capacitor through a thermal interface material.

18. The method of claim 15, wherein the capacitor is mounted directly to the cover of the housing, and wherein the capacitor is not mounted to the housing.

19. The method of claim 15, wherein the heatsink is exposed to the external environment of the housing.

20. The method of claim 15, wherein the capacitor directly contacts the heatsink.

* * * * *